(12) United States Patent
Yamaji et al.

(10) Patent No.: US 6,198,165 B1
(45) Date of Patent: Mar. 6, 2001

(54) SEMICONDUCTOR DEVICE

(75) Inventors: Yasuhisa Yamaji, Yamatokoriyama; Yoshiki Sota, Nara; Yasuki Fukui, Tenri, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/322,925

(22) Filed: Jun. 1, 1999

(30) Foreign Application Priority Data

May 29, 1998 (JP) .................................................. 10-148877

(51) Int. Cl.⁷ .............................. H05K 7/20; H01L 23/12; H01L 23/28; H01L 23/48
(52) U.S. Cl. ......................... 257/734; 257/737; 257/738; 257/693; 257/692; 257/676; 257/668; 257/787; 257/792
(58) Field of Search ..................................... 257/734, 737, 257/738, 693, 646, 668, 692, 691, 787, 676, 778, 792, 687

(56) References Cited

U.S. PATENT DOCUMENTS

| | | | | |
|---|---|---|---|---|
| 5,185,613 | * | 2/1993 | Whatmore et al. | 343/909 |
| 5,285,352 | * | 2/1994 | Pasture et al. | 257/712 |
| 5,677,575 | * | 10/1997 | Maeta et al. | 257/778 |
| 5,763,939 | * | 6/1998 | Yamashita | 257/668 |
| 5,773,882 | * | 6/1998 | Iwasaki | 257/692 |
| 5,780,933 | * | 7/1998 | Ohmori et al. | 257/788 |
| 5,814,890 | * | 9/1998 | Iwasaki | 257/778 |
| 5,814,894 | * | 9/1998 | Igarashi et al. | 257/787 |
| 5,901,046 | * | 5/1999 | Ohto at al. | 1/760 M |
| 5,909,058 | * | 6/1999 | Yano et al. | 257/712 |
| 5,914,531 | * | 6/1999 | Tsunoda et al. | 257/668 |
| 5,982,033 | * | 11/1999 | Ohsawa et al. | 257/737 |
| 5,990,546 | * | 11/1999 | Igarashi et al. | 257/700 |

FOREIGN PATENT DOCUMENTS

| | | |
|---|---|---|
| 121002 | 5/1997 | (JP) . |
| 9-121002 | 5/1997 | (JP) . |
| 9-263734 | 10/1997 | (JP) . |

* cited by examiner

*Primary Examiner*—Alexander O. Williams
(74) *Attorney, Agent, or Firm*—Nixon & Vanderhye P.C.

(57) ABSTRACT

A semiconductor device includes a wiring substrate having wiring and a solder resist for protecting the wiring, which are provided on an insulating substrate, a semiconductor chip which is mounted via the wiring protective film on the wiring substrate on a surface on the other side of the surface on which a circuit is provided to face a side of the wiring substrate on which the wiring is formed, and a wire for electrically connecting the circuit provided on the surface of the semiconductor chip and the wiring of the wiring substrate, and the surface of the solder resist and the semiconductor chip are firmly adhered to each other. In this semiconductor device, because the solder resist and the semiconductor chip are firmly adhered to each other, there arise no bubbles due to a spacing at a portion where the solder resist and the semiconductor chip are bonded with each other. As a result, a crack generated when heating the semiconductor device when installing it in electrical devices can be prevented, and the percent defective can be significantly reduced in a reliability test after bonding is made.

10 Claims, 16 Drawing Sheets

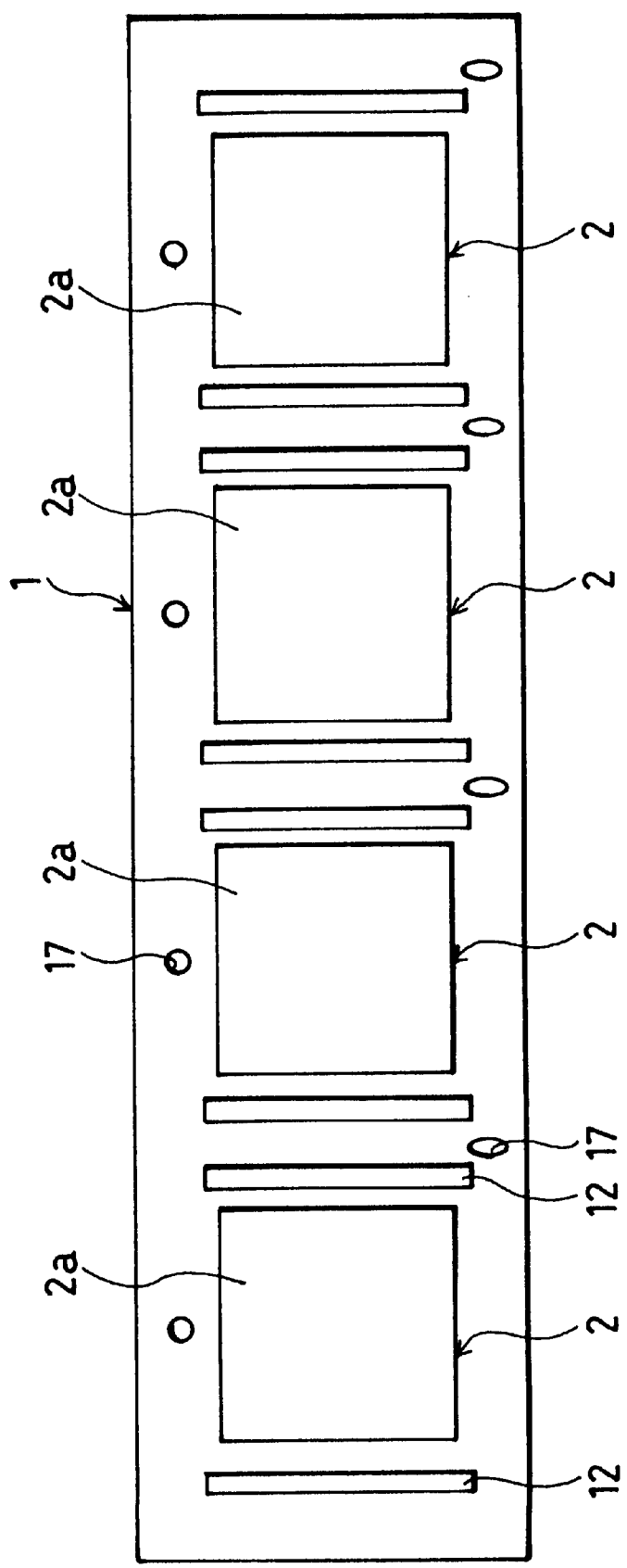

SEMICONDUCTOR DEVICE

FIELD OF THE INVENTION

The present invention relates to a semiconductor device for use in electrical devices and a manufacturing method thereof, and particularly relates to a technique for improving insufficient bonding between in particular a semiconductor chip and a wiring substrate in a semiconductor device of a BGA (Ball Grid Array) type.

BACKGROUND OF THE INVENTION

As a semiconductor device which complies with a recent trend in miniaturization of electrical devices, and which conforms with an automated assembly process, a chip size package (CSP) semiconductor device of a QFP (Quad Flat Package) type or a BGA (Ball Grid Array) type has been widely used.

These semiconductor devices require larger numbers of external connection terminals ever before as a result of faster and higher functioning signal processes of semiconductor element in the semiconductor device.

However, in the semiconductor device of a QFP type ("QFP type semiconductor device" hereinafter), it is difficult to increase the number of external connection terminals due to the fact that the external connection terminals are provided along the outer periphery of the external package.

On the other hand, in the semiconductor device of a BGA type ("BGA type semiconductor device" hereinafter), the number of external connection terminals can be increased more easily because the external connection terminals are provided two-dimensionally on the bottom surface of the package.

Thus, when it is required to increase the number of external connection terminals to realize faster and higher functioning signal processes on the semiconductor element, the BGA type semiconductor device is adopted.

Also, the BGA type semiconductor device has the package size which is reduced as small as possible to be close to the size (chip size) of the semiconductor chip so that it can be installed in a portable device as a small electrical device.

For example, Japanese Unexamined Patent Publication No. 121002/1997 (Tokukaihei 9-121002) (published date:May 6, 1997) discloses a semiconductor device as the BGA type semiconductor device wherein a semiconductor chip is connected to a wiring substrate by wire bonding with the surface of the semiconductor chip formed with MOS transistors, etc., facing upward, and the semiconductor chip is conducted to the external connection terminals via a wiring pattern of the wiring substrate.

The above BGA type semiconductor device has the structure, as shown in FIG. 11, in which a semiconductor chip 22 is bonded with a wiring substrate 21 by an adhesive paste 35, and the wiring substrate 21 and the semiconductor chip 22 are connected to each other by a conductive wire 23, and resin sealing is made by a mold resin 24.

The wiring substrate 21 has an arrangement in which a wiring pattern 28 is formed on an insulating substrate 26, and an internal connection region 32 on the periphery of the wiring pattern 28 and the electrode pad 33 on the upper surface of the semiconductor chip 22 are connected to each other by the wire 23.

On the wiring of the wiring substrate 21 is formed a solder resist 27, except on the internal connection region 32.

The wiring pattern 28 has the pattern as shown in FIG. 12, and other than the internal connection region 32 as shown in FIG. 11, there is formed an external connection region 30 along the periphery of a through hole 29 formed on the insulating substrate 26.

As shown in FIG. 11, the external connection region 30 is connected to an external connection terminal 25 made of a solder ball via the through hole 29. As a result, wiring is made from the semiconductor chip 22 and the internal connection region 32 connected to each other by the wire 23, via the external connection region 30, to the external connection terminal 25 formed on the lower side of the wiring substrate 21.

In the BGA type semiconductor device, in order to connect the semiconductor chip 22 to the wiring substrate 21, the adhesive paste 35 is used as described above. In such a case, the connection is made by the method in which an appropriate amount of the adhesive paste 35 is dropped on the wiring substrate 21, and the semiconductor chip 22 is bonded with the wiring substrate 21 on which the adhesive paste 35 was applied.

However, in this method of dropping the adhesive paste 35 on the wiring substrate 21, the amount of drops is not constant and various problems are generated by the difference in amount of drops.

For example, when the amount of the adhesive paste 35 dropped is excessive, as shown in FIG. 11, there is a case where the adhesive paste 35 protrudes over the internal connection region 32 of the wiring pattern 28. This causes a problem that the internal connection region 32 and the semiconductor chip 22 cannot be appropriately connected by the wire 23 due to the fact that the internal connection region 32 cannot be sufficiently provided.

On the other hand, when the amount of the adhesive paste 35 dropped is deficient, the adhesive paste 35 cannot be spread over the entire lower surface of the semiconductor chip 22, and there arise a spacing between the semiconductor chip 22 and the wiring substrate 21. This causes a problem that the semiconductor chip 22 is easily peeled off from the wiring substrate 21.

In order to solve this problem induced by the varying amount of drops of the adhesive paste 35, a method using an adhesive film instead of adhesive paste has been available.

For example, Japanese Unexamined Patent Publication No. 263734/1997 (Tokukaihei 9-263734) (published date:Oct. 7, 1997) discloses a semiconductor device having a structure, as shown in FIG. 13, in which the semiconductor chip 22 and the wiring substrate 21 are bonded with each other by an adhesive film 31.

Incidentally, in general, the solder resist 27 is formed so as to cover the wiring pattern 28 on the insulating substrate 26, and for this reason the surface of the solder resist 27 is in the form of concave and convex portions.

Thus, when the adhesive film 31 is mounted on the solder resist 27, there arises a spacing between the solder resist 27 and the adhesive film 31.

Also, when mounting the semiconductor chip 22, because the adhesive film 31 on the wiring substrate 21 has been heated already, the adhesive film 31 mounted on the wiring substrate 21 is softened and flows down into the concave portion on the surface of the solder resist 27, and as a result the surface shape of the adhesive film 31 becomes the copy of the concave and convex portions on the surface of the solder resist 27. When the semiconductor chip 22 is bonded with the adhesive film 31 thus deformed, there arise a spacing 36 as shown in FIG. 13 between the semiconductor chip 22 and the adhesive film 31.

If the semiconductor chip 22 is to be bonded with the wiring substrate 21 using such an adhesive film 31, it is required to move the semiconductor chip 22 back and forth in a direction parallel to the surface of the wiring substrate 21 while pressing the semiconductor chip 22 against the wiring substrate 21 so that the lower surface of the semiconductor chip 22 completely contacts the adhesive film 31.

However, even when the semiconductor chip 22 is bonded with the wiring substrate 21 in this manner by pressing, the spacing 36 generated between the semiconductor chip 22 and the adhesive film 31 cannot be eliminated completely, and the spacing 36 remains as bubbles at the portion where bonding is made.

As a result, by the bubbles at the portion where bonding is made, when the BGA type semiconductor device having a chip size package, for example, as shown in FIG. 12, is to be made connected to a print substrate, etc., of a portable device, etc., by heating, the chip size package is cracked by heat, presenting a problem that the percent defective is increased in a reliability test after connection is made.

The bubbles are generated at the portion where bonding is made because, as described, the bonding surface of the semiconductor chip 22 with the wiring substrate 21 takes the form of the concave and convex portions of the solder resist 27 due to the fact that the wiring pattern 8 is formed on the insulating substrate 26 and the solder resist 27 is formed thereon.

Thus, by forming the wiring pattern 28 on the lower surface of the insulating substrate 26 on the other side of the bonding surface of the semiconductor chip 22 with the wiring substrate 21, the bonding surface of the semiconductor chip 22 becomes level, and no bubbles are generated by the bonding of the semiconductor chip 22 and the wiring substrate 21.

However, when the wiring pattern 28 is to be formed on the lower surface of the insulating substrate 26 on the other side of the bonding surface of the semiconductor chip 22 in the described manner, in order to connect the wiring pattern 28 and the semiconductor chip 22 by the wire 23, it is required to provide the internal connection region 32 on the upper surface of the insulating substrate 26, that is, on the bonding surface of the semiconductor chip 22.

For this reason, the wiring pattern 28 needs to be provided on the both sides of the insulating substrate 26, and it is required to provide a through hole for wiring the internal connection region 32 and the external connection region 30 of the wiring pattern 28. To realize this, it is required to take a unique measure for connecting the wiring on the both sides of the wiring substrate 21, and this makes the manufacturing steps of the semiconductor device complex and increases the cost associated with manufacturing the semiconductor device.

SUMMARY OF THE INVENTION

An object of the present invention is to provide a semiconductor device having a bonding structure in which a semiconductor chip is bonded with a surface of a wiring substrate which surface is provided with a wiring pattern so as to prevent bubbles from being generated at the portion of bonding, and to provide a manufacturing method of such a semiconductor device, so that a crack generated when heating the semiconductor device when installing it in electrical devices is prevented, and that the percent defective can be significantly reduced in a reliability test after bonding is made.

In order to achieve the above object, a semiconductor device of the present invention includes: a wiring substrate having at least wiring and a wiring protective film for protecting the wiring, the wiring and the wiring protective film being provided on an insulating substrate; a semiconductor chip which is mounted on the wiring substrate on a surface on the other side of a surface provided with a circuit to face a surface of the wiring substrate which surface is provided with the wiring; and a conducting wire for connecting the circuit provided on the surface of the semiconductor chip and the wiring of the wiring substrate, wherein a surface of the wiring protective film and the semiconductor chip are firmly adhered to each other.

In this semiconductor device, because the wiring protective film and the semiconductor chip are firmly adhered to each other, there arise no bubbles due to a spacing at the portion where the wiring protective film and the semiconductor chip are bonded with each other. As a result, a crack generated when heating the semiconductor device when installing it in electrical devices can be prevented, and the percent defective can be significantly reduced in a reliability test after bonding is made.

In order to firmly adhere the wiring protective film and the semiconductor chip to each other as above, it is possible to provide dummy wiring between wiring formed on the insulating substrate in such a manner that the dummy wiring is insulated from the wiring and the thickness thereof is substantially the same as that of the wiring.

By providing the dummy wiring between the wiring on the insulating substrate in this manner, the concave portion on the surface of the insulating substrate can be reduced. As a result, it is possible to substantially level the surface of the wiring protective film, which is formed so as to cover the wiring and the dummy wiring of the insulating substrate.

Thus, the semiconductor chip can be firmly adhered on the wiring protective film when mounting the semiconductor chip on the wiring substrate.

In order to firmly adhere the wiring protective film and the semiconductor chip to each other, the thickness of the wiring protective film may be set so as to eliminate the adverse effect of the surface shape of the wiring protective film due to the shape of the wiring.

By increasing the thickness of the wiring protective film to some extent in this manner, the effect of the concave and convex portions of the wiring formed on the insulating substrate can be reduced and the surface of the wiring protective film can be leveled.

Further, a manufacturing method of a semiconductor device of the present invention includes the steps of (1) composing a wiring substrate by forming at least wiring and then a wiring protective film for protecting the wiring on an insulating substrate; (2) making a semiconductor chip by attaching an adhesive film on a surface of a wafer of the semiconductor chip on the other side of a surface provided with a circuit; (3) firmly adhering the surface of the semiconductor chip to which surface is attached the adhesive film and the wiring protective film of the wiring substrate; and (4) electrically connecting the circuit on the surface of the semiconductor chip and the wiring of the wiring substrate by a wire so as to seal the semiconductor chip and the wire entirely with resin.

For a fuller understanding of the nature and advantages of the invention, reference should be made to the ensuing detailed description taken in conjunction with the accompanying drawings.

BRIEF DESCRIPTION OF THE DRAWINGS

FIG. 5 is a plan view showing a state in which semiconductor chips are mounted on a lead frame constituting the wiring substrate.

DESCRIPTION OF THE EMBODIMENTS

The following will describe one embodiment of the present invention. Note that, the explanation will be given through the case of a semiconductor device of a BGA (Ball Grid Array) type.

Figure 1:
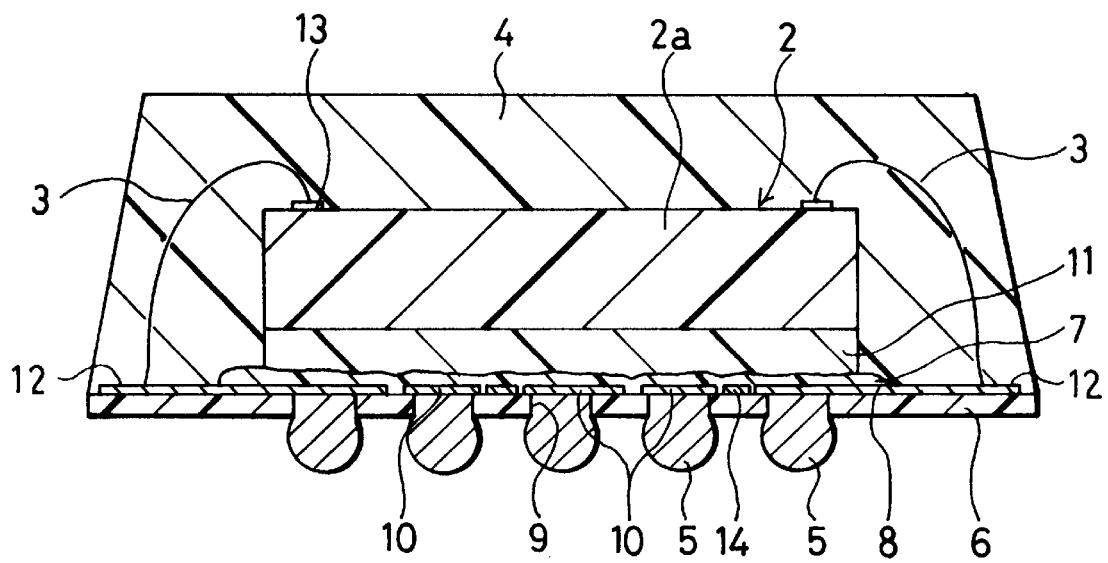
FIG. 1 is a schematic cross sectional view of a semiconductor device in accordance with one embodiment of the present invention.

As shown in FIG. 1, a semiconductor device of a BGA type in accordance with the present embodiment is composed of (A) a resin sealing section of a sealing resin 4 sealing a wiring substrate 1 as a wiring board, a semiconductor chip 2 combined with the wiring substrate 1, and a conductive wire (lead wire) 3 for making an electrical connection between the semiconductor chip 2 and the wiring substrate 1, and (B) an external terminal section made of an external connection terminal 5 formed with a solder bump.

Namely, the semiconductor device of a BGA type is a resin sealing type semiconductor device in which the semiconductor chip 2 combined with the wiring substrate 1, and the wire 3 for electrically connecting the wiring substrate 1 and the semiconductor chip 2 are sealed with the sealing resin 4 for protection.

The wiring substrate 1 is composed of two insulating layers of (i) an insulating substrate 6 as an insulating layer on the side of the external connection terminal 5, for which a polyimide film chiefly made of polyimide resin with a thickness of around 75 μm is used and (ii) a solder resist 7 as an insulating layer on the side of the semiconductor chip 2, whose main component is polyimide resin, and a wiring layer of a wiring pattern 8 and a dummy wiring pattern 14 having the same thickness as that of the wiring pattern 8, which is provided between the two insulating layers.

The wiring pattern 8 is a metal foil made of copper having a thickness of around 20 μm and is patterned in a predetermined shape on an upper surface of the insulating substrate 6 which is provided with a through hole 9. The wiring pattern 8 is composed of an external connection region 10, a portion of which in the vicinity of the through hole 9 is connected to the external connection terminal 5, and an internal connection region 12 which is connected to the semiconductor chip 2 by the wire 3 on the periphery of the insulating substrate 6.

Figure 2:
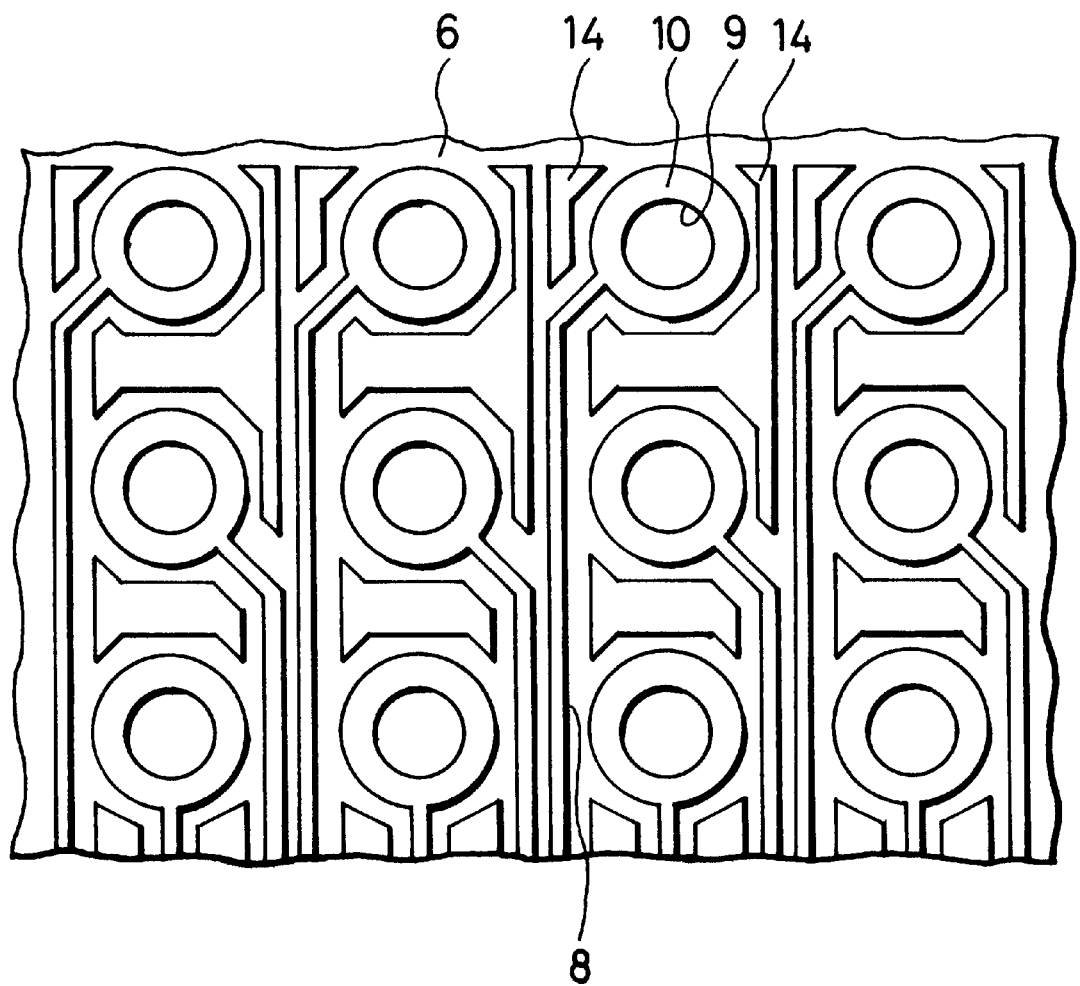
FIG. 2 is a plan view showing a state in which a wiring pattern and a dummy wiring pattern are formed on an insulating substrate which is provided on the semiconductor device of FIG. 1.

The dummy wiring pattern 14 is patterned in a predetermined shape with metal such as copper on the upper surface of the insulating substrate 6 so as not to overlap with the wiring pattern 8. Namely, as shown in FIG. 2, the dummy wiring pattern 14 is patterned between the pattern of the wiring pattern 8.

Note that, in the present embodiment, the dummy wiring pattern 14 is patterned in a thickness of 20 μm since the thickness of the wiring pattern 8 is 20 μm.

The external connection terminal 5 provided on a lower surface of the wiring substrate 1 is formed by connecting the solder bump to the external connection region 10 of the wiring pattern 8.

The solder bump is formed by mounting a ball made of solder on the through hole 9 provided on the insulating substrate 6 from the opposite side of the surface of the insulating substrate 6 on which the wiring pattern 8 is formed. Therefore, prior to forming the solder bump on the wiring substrate 1, the wiring pattern 8 is in an exposed state through the through hole 9 in the vicinity of the external connection region 10.

Incidentally, the surface of the solder resist 7 formed on the upper surface of the insulating substrate 6 generally takes the form which reflects the shape of the surface of the insulating substrate 6 regardless of the viscosity of the solder resist 7.

Figure 11:
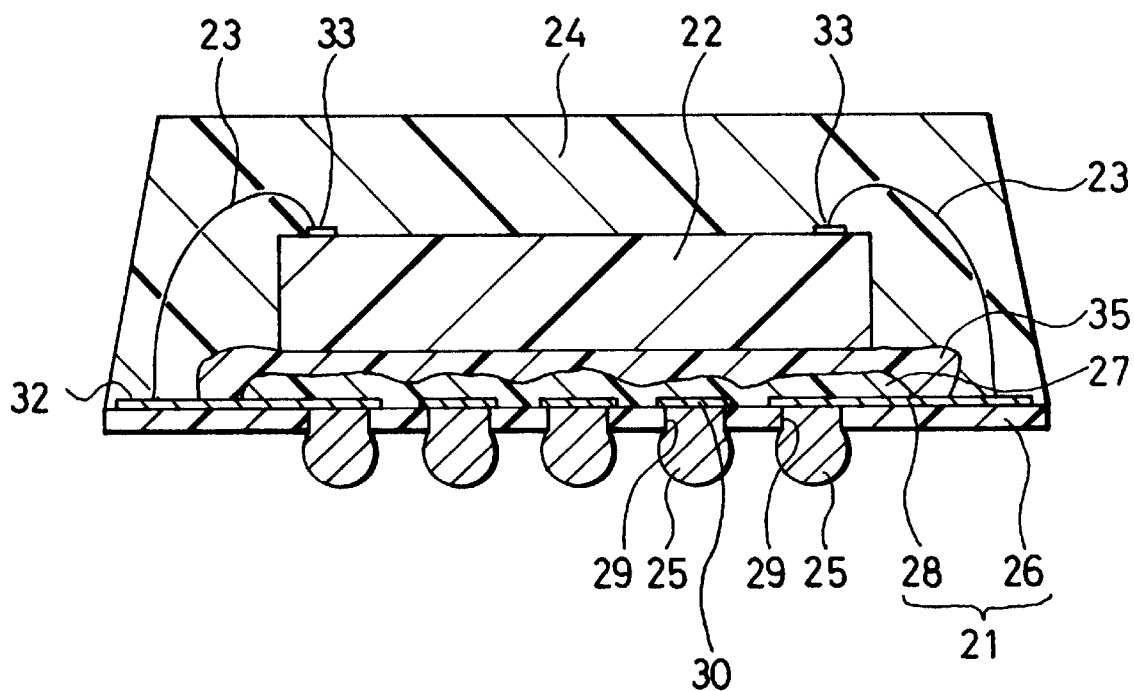
FIG. 11 is a schematic cross sectional view of a conventional semiconductor device.
Figure 12:
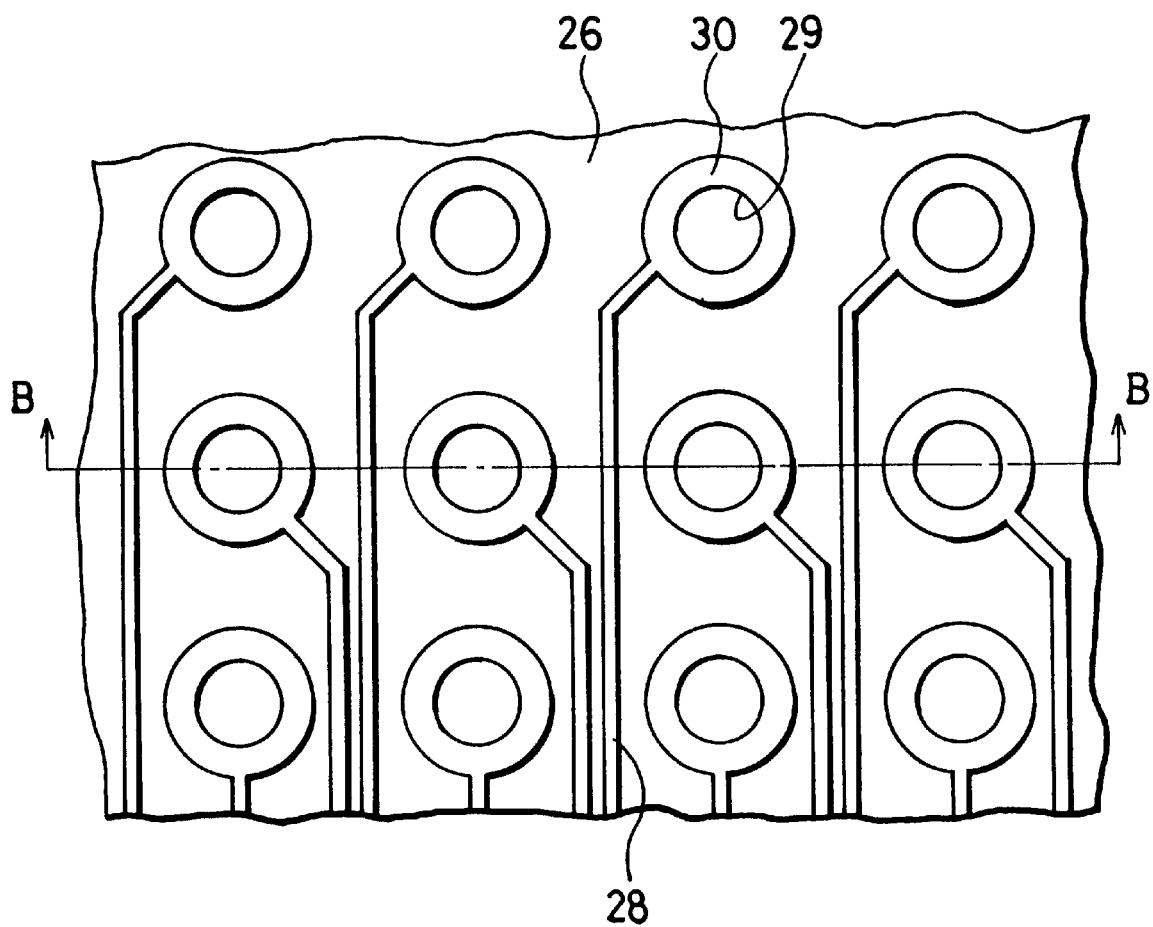
FIG. 12 is a plan view showing a state in which a wiring pattern is formed on an insulating substrate which is provided on the semiconductor device of FIG. 11.
Figure 13:
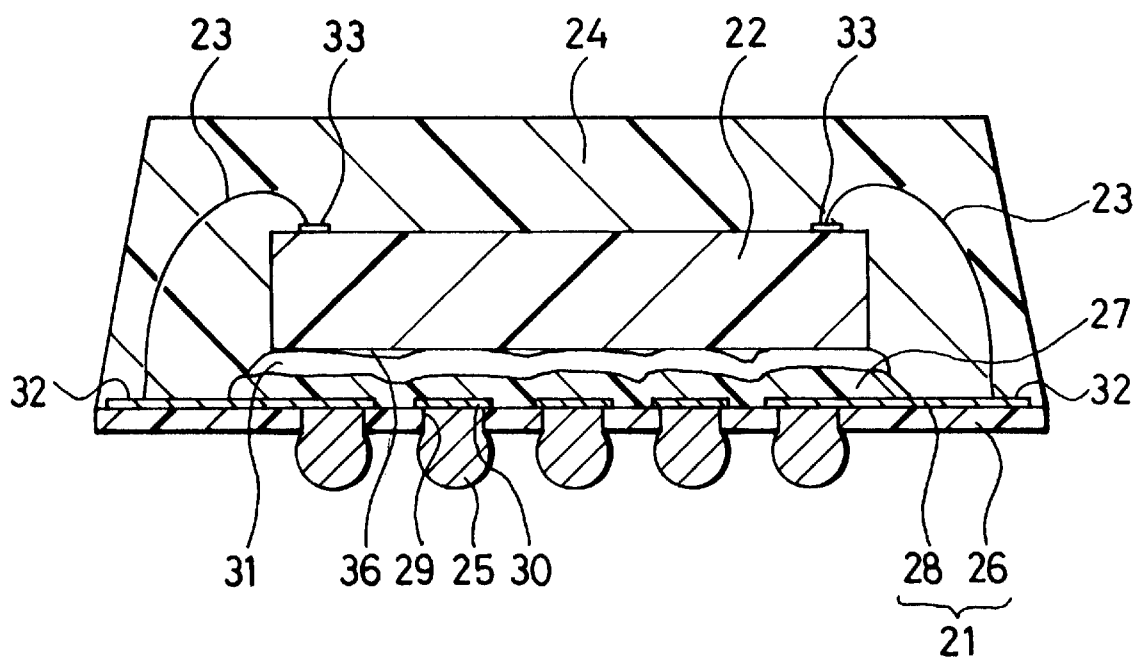
FIG. 13 is a schematic cross sectional view of another conventional semiconductor device.

For example, as shown in FIG. 11 and FIG. 12, which show the prior art, when a wiring pattern 28 is patterned in a predetermined pattern on an insulating substrate 26, the surface shape of a solder resist 27 formed on an upper surface of the insulating substrate 26 becomes in the form of concave and convex portions, reflecting the pattern of the wiring pattern 28. In such a case, when the pattern intervals of the wiring pattern 28 are wide, the concave portion on the surface of the solder resist 27 becomes wide.

However, as shown in FIG. 2, by providing the dummy wiring pattern 14 between the pattern of the wiring pattern 8 provided on the surface of the insulating substrate 6, the concave portion on the surface of the solder resist 7 formed on the insulating substrate 6 and the wiring pattern 8 becomes less prominent, thereby substantially leveling the surface of the solder resist 7.

In this manner, by substantially leveling the surface of the solder resist 7, the adhesion between the solder resist 7 and the semiconductor chip 2 bonded thereon is improved. Namely, it is possible to almost completely eliminate a spacing due to the surface shape of the solder resist 7 when the solder resist 7 is bonded on the lower surface of the semiconductor chip 2. As a result, there occur no bubbles due to the spacing at the portion where the solder resist 7 and the semiconductor chip 2 are bonded with each other.

The semiconductor chip 2, as shown in FIG. 1, is composed of a wafer 2a whose upper surface is provided with a circuit, and an adhesive film 11 bonded on the other surface (back surface) of the upper surface of the wafer 2a on which the circuit is formed.

The surface of the wafer 2a on which the circuit is formed is provided with an electrode pad 13, and the electrode pad 13 is electrically connected to the internal connection region 12 of the wiring pattern 8 by the wire 13 when the semiconductor chip 2 is bonded with the wiring substrate 1.

Meanwhile, the adhesive film 11 is firmly adhered and fixed on the back surface of the wafer 2a. Thus, actually, the semiconductor chip 2 is bonded and fixed on the wiring substrate 1 by the adhesive film 11 bonded on the back surface of the wafer 2a, which is bonded with the solder resist 7.

The thickness of the adhesive film 11 is around 20 $\mu$m to 40 $\mu$m and is capable of absorbing the concave and convex portions of the solder resist 7 to some extent formed on the upper surface of the wiring substrate 1. Thus, by substantially leveling the surface of the solder resist 7 in the described manner, the adhesion between the solder resist 7 and the adhesive film 11 can be further improved.

The following describes manufacturing steps of the BGA type semiconductor device having the described arrangement referring to FIG. 3 through FIG. 6.

First, the manufacturing steps of the semiconductor chip 2 constituting the BGA type semiconductor device will be described.

The semiconductor chip 2 is arranged such that the adhesive film 11 is bonded on the back surface of the wafer 2a prior to being combined with the wiring substrate 1. The wafer 2a is obtained by dicing a wafer which has been provided with a predetermined circuit on the upper surface, and for this reason the back surface thereof is level. Therefore, the back surface of the wafer 2a and the adhesive film 11 can be easily brought into a firmly adhered state.

Figure 3:
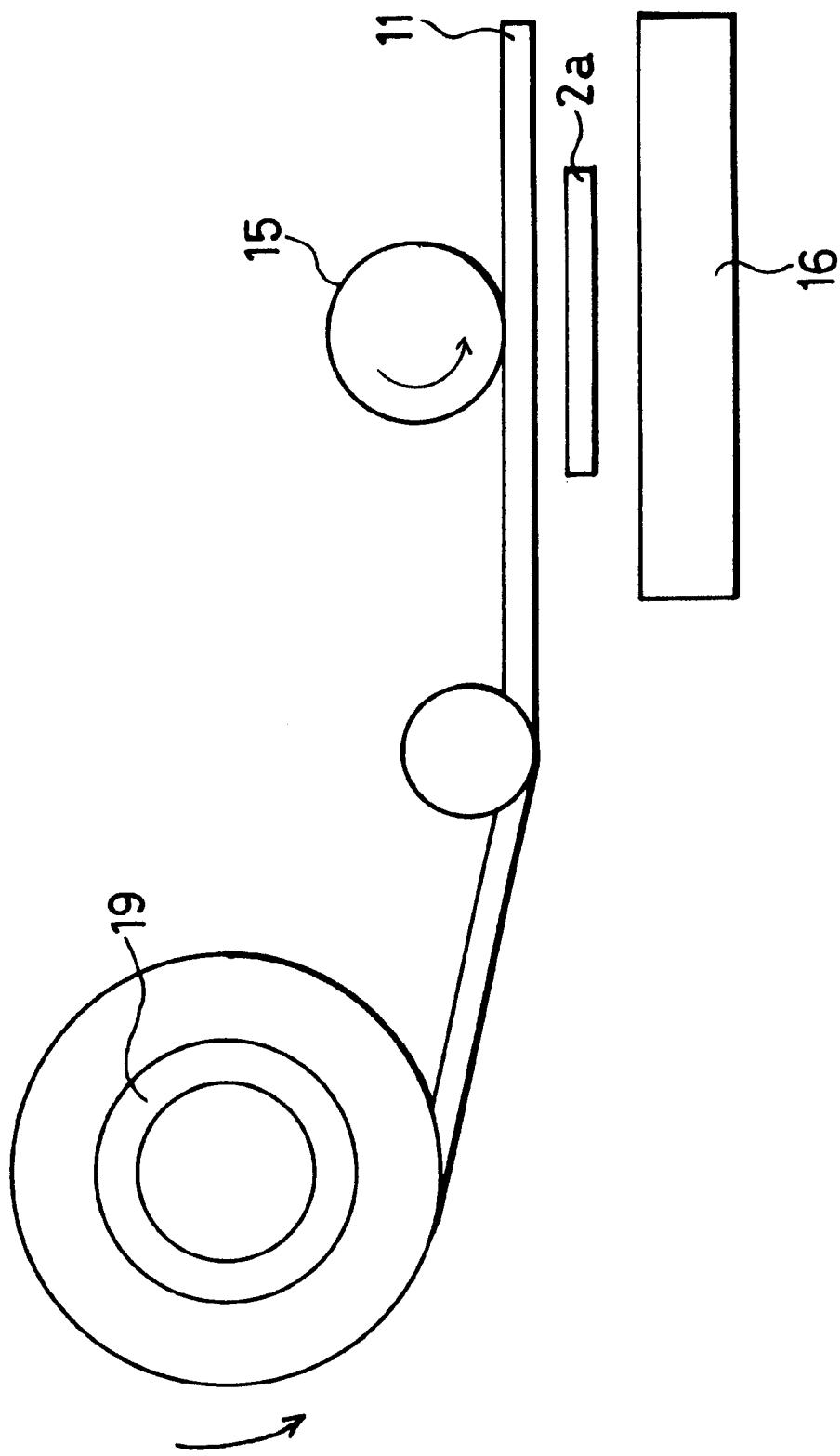
FIG. 3 is a schematic structural view of a device for bonding an adhesive film on a wafer of a semiconductor chip provided on the semiconductor device of FIG. 1

The adhesive film 11 is bonded on the back surface of the wafer 2a in the manner for example as shown in FIG. 3. The adhesive film 11 having a sufficient width with respect to the width of the wafer 2a, which is wounded around a roll core 19 is sent between a heat roller 15 and a hot plate 16, and the adhesive film 11 is attached by the heat roller 15 over the back surface of the wafer 2a on which no circuit is formed and which has been placed on the hot plate 16, while ensuring no bubbles are trapped between the adhesive film 11 and the wafer 2a.

Note that, in the present embodiment, the adhesive film 11 is attached over the wafer 2a with the temperature of the hot plate being 125° C., the temperature of the heat roller 15 being 40° C., and the pressure between the heat roller 15 and the hot plate 16 being 1 kg/cm$^2$.

The adhesive film 11 attached over the wafer 2a in the described manner is cut in the same size as that of the wafer 2a. After cutting, the surface of the semiconductor chip 2 on the side of the adhesive film 11 is attached on a dicing sheet having low adhesion so as to carry out dicing. The dicing is carried out by full dicing in which the wafer 2a and the adhesive film 11 are both cut, and the division is made per wafer 2a, and the wafer 2a thus divided is separated out from the dicing sheet.

Figure 4:
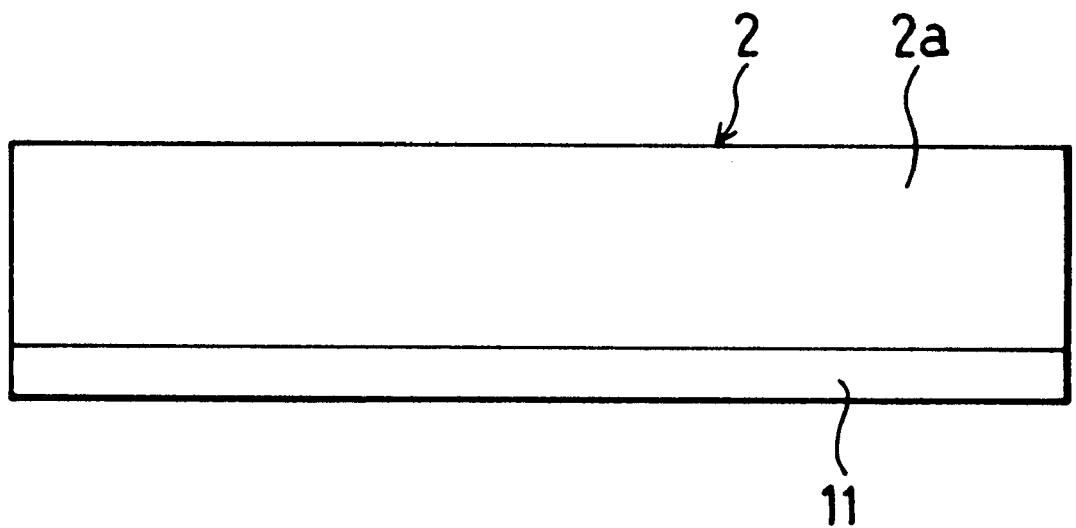
FIG. 4 is a schematic structural view of the semiconductor chip provided on the semiconductor device of FIG. 1.

In this manner, by cutting the adhesive film 11 which is attached to the wafer 2a, it is possible to obtain the semiconductor chip 2 as shown in FIG. 4 having the same size as that of the wafer 2a, which is provided with the adhesive film 11 bonded on the back surface of the wafer 2a.

In this semiconductor chip 2, to the back surface of the wafer 2a has already been attached the adhesive film 11 of the same size, thus preventing a positioning error when mounting the semiconductor chip 2 on the wiring substrate 1.

Also, because the size of the adhesive film 11 is the same as that of the wafer 2a, the internal connection region 12 of the wiring substrate 1 can be made closer to the side of the semiconductor chip 2. As a result, the wire 3 for connecting the electrode pad 13 of the semiconductor chip 2 and the internal connection region 12 of the wiring substrate 1 can be made shorter, thereby further reducing the size of the BGA type semiconductor device.

As shown in FIG. 5, the semiconductor chip 2 is mounted on a predetermined position on the wiring substrate 1 in the form of a film provided with the internal connection region 12. Note that, in FIG. 5, the solder resist 7 and the wiring pattern 8 constituting the wiring substrate 1 are omitted; however, actually, they are provided so as to expose at least the internal connection region 12.

On the both sides of the wiring substrate 1 are provided a plurality of openings 17. The openings 17 are for transport and positioning of the wiring substrate 1. The semiconductor chip 2 is mounted on the wiring substrate 1 while positioning is made, and then the wiring substrate 1 is cut per semiconductor chip 2, thus making the BGA type semiconductor device.

The following describes manufacturing steps for mounting the semiconductor chip 2 as manufactured by the described manufacturing steps on the wiring substrate 1, referring to FIG. 6(a) through FIG. 6(e). Note that, in the present embodiment, thermoplastic resin containing thermosetting resin is used as the material of the adhesive film 11.

Figures 6A, 6B, 6C:
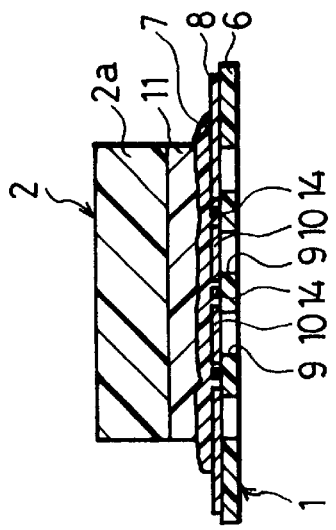
FIG. 6(a) through FIG. 6(e) are explanatory drawings showing manufacturing steps of the semiconductor device of FIG. 1.
Figure 6D:
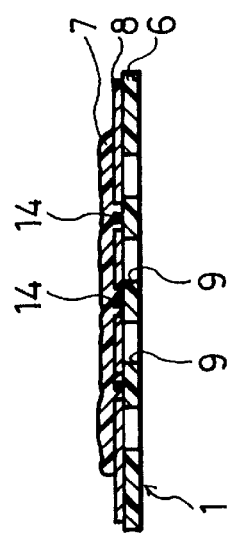
Figure 6E:
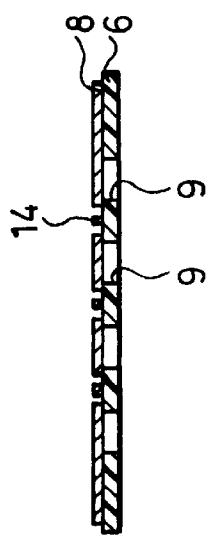

First, as shown in FIG. 6(a), the wiring pattern 8 and the dummy wiring pattern 14 are patterned in a predetermined pattern without overlap over the insulating substrate 6 on which the through hole 9 is formed on a predetermined position. The insulating substrate 6 is made of polyimide and has an insulation resistance of around 5×10$^{13}$ Ω.

Here, the insulating substrate 6 is made of polyimide resin and the insulation resistance thereof is around 5×10$^{13}$ Ω. The wiring pattern 8 and the dummy wiring pattern 14 are both formed with a metal foil made of copper with a thickness of around 20 $\mu$m. Note that, even though the wiring pattern 8 and the dummy wiring pattern 14 are directly formed on the insulating substrate 6, they may be formed on the insulating substrate 6 via an adhesive.

The internal connection region 12 of the wiring pattern 8 of the wiring substrate 1 is plated with gold of not more than several $\mu$m to make a desirable connection with the wire 3. Here, because of the possibility that the gold and copper form an alloy, between the plated gold and the wiring pattern 8 and the internal connection region 12 is plated with nickel and palladium of around several $\mu$m to suppress formation of an alloy layer of gold and copper. In the present embodiment, gold, nickel, and vanadium are plated with a thickness of 0.03 µm to 0.08 µm, 5 µm to 8 µm, and 0.1 µm to 0.7 µm, respectively.

Note that, these metals may be plated by either non-electrolytic plating or electrolytic plating. These plated layers are also formed on the external connection region 10.

The through hole 9 of the insulating substrate 6 and the wiring pattern 8 constituting the wiring substrate 1 are positioned closer towards the center of the insulating substrate 6 than the internal connection region 12 formed on the periphery of the insulating substrate 6. Also, the through hole 9 on the insulating substrate 6 is formed by etching, drilling, or molding.

As the wire 3 for making an electrical connection between the internal connection region 12 of the wiring pattern 8 and the electrode pad 13 of the semiconductor chip 2, a flexible thin wire of several ten µm made of metal having good conductivity such as gold and copper is used.

Then, as shown in FIG. 6(*b*), the solder resist 7, whose main component is epoxy resin, is formed as a wiring protective film on the wiring pattern 8 and the dummy wiring pattern 14 provided on the insulating substrate 6. Here, because the dummy wiring pattern 14 is formed on the insulating substrate 6 in addition to the wiring pattern 8, the surface of the solder resist 7 formed on the insulating substrate 6 becomes substantially level.

In this manner, the wiring substrate 1 composed of the insulating substrate 6, the solder resist 7, the wiring pattern 8, and the dummy wiring pattern 14 is formed.

Even though the solder resist 7 includes a resin component which is different from the insulating substrate 6, the resin component of the solder resist 7 may be the same as the insulating substrate 6.

The wiring substrate 1 having the described arrangement, as shown in FIG. 5, is in the form of a film, and it is cut into pieces of a predetermined size after a step of resin sealing (to be described later) is finished.

Then, as shown in FIG. 6(*c*), the semiconductor chip 2 is bonded on the substantially level surface of the solder resist 7 formed on the insulating substrate 6 by thermal compression bonding on a predetermined position of the wiring substrate 1, wherein the semiconductor chip 2 is pressed against the solder resist 7 while heating, with the surface of the adhesive film 11 bonded with the back surface of the wafer 2*a* facing downward. The material of the adhesive film 11 is a thermoplastic resin containing thermosetting resin, and for this reason the adhesive film 11 is cured and stabilized by heating at a temperature of 100° C. to 250° C. after the semiconductor chip 2 is bonded with the adhesive film 11 by thermal compression bonding.

Here, the total thickness of the solder resist 7 and the adhesive film 11 combined together is made substantially the same as the thickness of the sealing resin 4 sealing the semiconductor chip 2. As a result, the stress applied on the semiconductor chip 2 after sealing is made by the sealing resin 4 can be reduced.

Then, as shown in FIG. 6(*d*), electrical connection is made by the wire 3 made of metal between the electrode pad 13 formed on the upper surface of the semiconductor chip 2, that is, on the surface of the wafer 2*a* on which the circuit is formed, and the internal connection region 12 on the outer periphery of the wiring pattern 8 of the wiring substrate 1 so as to ensure that the semiconductor chip 2 and the wiring substrate 1 are electrically conducted.

The connection of the wire 3 is made by the method in which the tip of the wire 3 is melted to be a ball by the electrical spark of, for example, a wire bonding device, and the ball of the wire 3 is bonded with the electrode pad 13 of the wafer 2*a*, and the wire 3 is extended to the internal connection region 12 of the wiring pattern 8 on the wiring substrate 1 by a tool, and finally the wire 3 is cut after bonding and connecting the wire 3 to the internal connection region 12. Other than this method, the connection of the wire 3 may be made by thermal compression bonding, ultrasonic compression bonding, or thermal ultrasonic compression bonding.

Then, as shown in FIG. 6(*e*), for protection of the semiconductor chip 2 and the wire 3, the resin sealing section is formed with the sealing resin 4 by a transfer mold over a region covering the semiconductor chip 2 and the wire 3. As the sealing resin 4, thermosetting resin such as epoxy resin, which is known to be reliable, is used.

Resin sealing by the sealing resin 4 is made in the following manner. Namely, the wiring substrate 1 and the semiconductor chip 2 as shown in FIG. 6(*d*) are set on a mold which takes into consideration the size of the semiconductor device, and the sealing resin 4 which has been melted is injected into the mold, and the sealing resin 4 is cured while maintaining an applied heat and applied pressure. After the sealing resin 4 is cured, the mold is removed.

Note that, in the present embodiment, resin sealing by the sealing resin 4 is made using a mold. However, not limiting to this method, it is possible to adopt, for example, the potting method which does not use a mold.

After resin sealing is made in the described manner for protection of the semiconductor chip 2 and the wire 3, the external connection terminal 5 is formed on the through hole 9 on the external connection region 10 of the wiring pattern 8 on the other side of the resin sealing. As the material of the external connection terminal 5, a metal such as copper, nickel, and solder is suitable. Note that, in the present embodiment, the explanation is given through the case where the material of the external connection terminal 5 is solder.

The external connection terminal 5 of the wiring substrate 1 is formed on a portion of the insulating substrate 6 where the through hole 9 is formed, and the external connection region 10 of the wiring pattern 8 is exposed through the through hole 9. After applying a flux to the external connection region 10, the external connection region 10 is attached to a solder ball and is heated in a reflow furnace to melt the solder ball, thereby connecting the external connection region 10 and the solder, and forming a solder bump to be the external connection terminal 5.

As the method of forming the external connection terminal 5, other than the above method using a solder ball, it is possible alternatively to form the solder bump to be the external connection terminal 5 by a method in which, for example, a solder in the form of a paste or sheet having an appropriate size is placed on the external connection region 10, and the external connection region 10 and the solder are heated in a reflow furnace to be melted and combined with each other.

The external connection terminal 5 is in the form of a ball in the above example. However, not limiting to this, it may be other shapes.

When using copper or nickel, instead of solder, as the material of the external connection terminal 5, it is required to coat the surface of the copper or nickel with a solder. In either case, these materials are melted once in a reflow furnace and later connected to the external connection region 10 to be formed. Namely, in either material, the external connection terminal 5 is formed by connecting a solder bump to the external connection region 10.

Finally, a portion of the wiring substrate 1 which is not required is cut. This is carried out along the periphery of the sealing resin 4.

In this manner, the BGA type semiconductor device in accordance with the present embodiment has the structure in which the semiconductor chip 2 is bonded with the wiring substrate 1 by the adhesive film 11, and the electrode pad 13 of the wafer 2a and the internal connection region 12 of the wiring substrate 1 are electrically connected to each other by the wire 3, and the semiconductor chip 2 and the wire 3 are sealed by the sealing resin 4, and a solder bump as the external connection terminal 5 is disposed on the lower surface of the wiring substrate 1 in an area array arrangement.

As described, the adhesive film 11 is heated at least twice in the manufacturing steps of the BGA type semiconductor device. Namely, the first heating is carried out when the wafer 2a is attached to the adhesive film 11, and the second heating is carried out when the semiconductor chip 2 is attached to the wiring substrate 1.

For this reason, it is required to select a material of the adhesive film 11 from materials whose adhesion is maintained in the second heating.

Therefore, as the material of the adhesive film 11 to be used for bonding of the semiconductor chip 2, a material having superior adhesion and heat-resistance, for example, such as polyimide resin, epoxy resin, or a mixture of polyimide resin and epoxy resin is suitably adopted, and the material may have thermoplastic or thermosetting properties.

Note that, as long as the dummy wiring pattern 14 has the same thickness as that of the wiring pattern 8, it may be a conductive film or insulating film. In particular, when the dummy wiring pattern 14 is made of the same material as that of the wiring pattern 8, the number of manufacturing steps of the semiconductor device can be reduced.

Table 1 shows the result of evaluation on reliability upon mounting between the BGA type semiconductor device manufactured in the described manner and a BGA type semiconductor device which was manufactured by a conventional manufacturing method. Here, the evaluation on reliability upon mounting refers to the proportion of defective products in the total number of samples when the temperature cycle was increased.

In Table 1, Sample No. A indicates a BGA type semiconductor device with the wiring pattern 8 of FIG. 2 and the solder resist 7 having a thickness of 30 μm, Sample No. B a BGA type semiconductor device with the wiring pattern 8 of FIG. 2 and the solder resist 7 having a thickness of 15 μm, and Sample No. C a BGA type semiconductor device with a wiring pattern 28 of FIG. 2 and a solder resist 27 having a thickness of 15 μm. A measurement of 15 samples were made at each temperature cycle.

The result shows that in Sample No. C which indicates a conventional BGA type semiconductor device, a defective product starts being generated at the temperature cycle of 1500, whereas in Sample No. B which indicates the BGA type semiconductor device of the present invention, a defective product starts being generated at the temperature cycle of 1700, and in Sample No. A which also indicates the BGA type semiconductor device of the present invention, no defective product was generated even at the temperature cycle of 2000.

Thus, it became clear that by reducing the concave and convex portions on the surface of the solder resist 7, generation of defective products can be significantly reduced.

In the present embodiment, the surface of the solder resist 7 is leveled by narrowing a region of the insulating substrate 6 on which the wiring pattern 8 is not formed. Namely, by reducing the concave and convex portions due to the wiring pattern 8 on a region of the insulating substrate 6 on which the solder resist 7 is formed, the concave and convex portions on the surface of the solder resist 7 are reduced and the surface thereof is leveled.

Specifically, as shown in FIG. 2, the dummy wiring pattern 14 is formed on a region of the insulating substrate 6 on which the wiring pattern 8 is not formed to increase the pattern area, and to reduce the concave and convex portions on the surface of the insulating substrate 6, and to level the surface of the solder resist 7. Here, by reducing the thickness of the wiring pattern 8 and the dummy wiring pattern 14 to around 12 μm, the surface of the solder resist 7 can be leveled further effectively.

Figure 7:
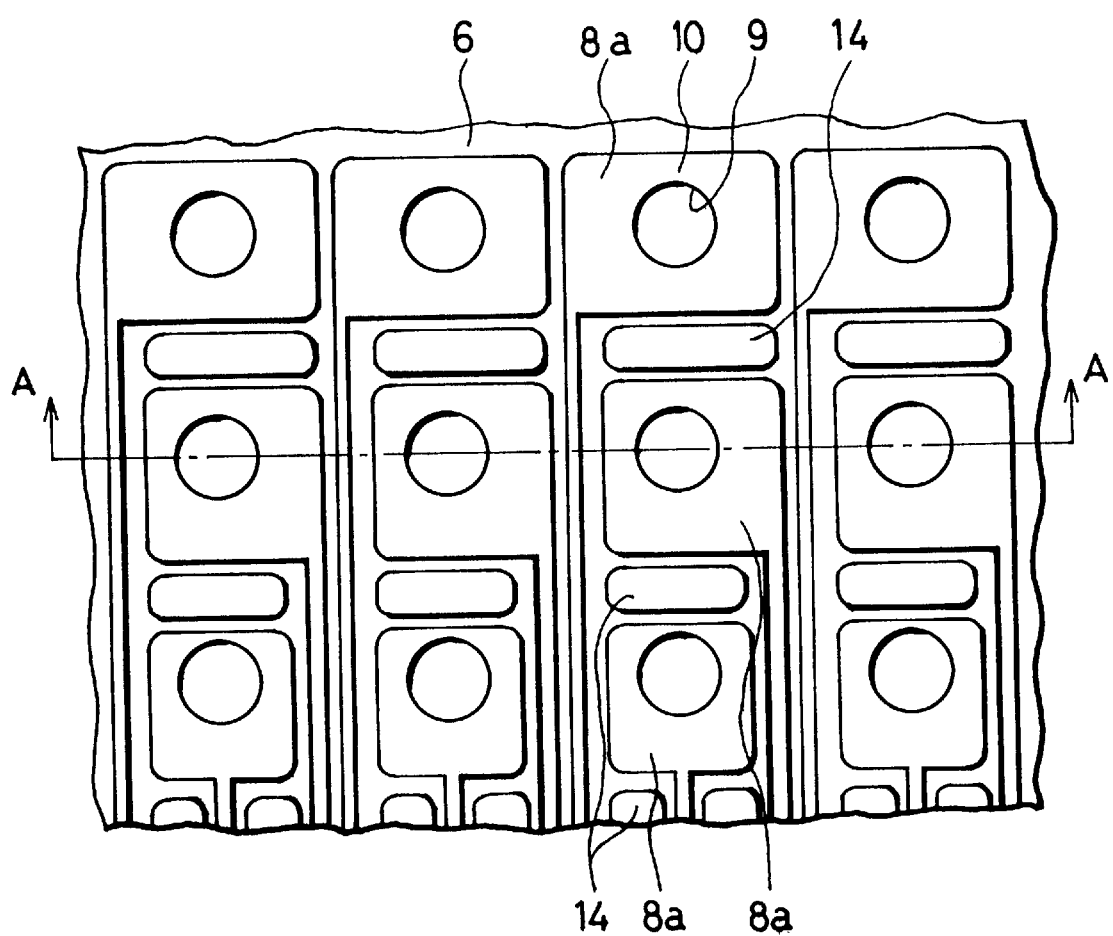
FIG. 7 is a plan view showing a state in which a wiring pattern and a dummy wiring pattern are formed on an insulating substrate which is provided on a semiconductor device in accordance with another embodiment of the present invention.
Figure 8:
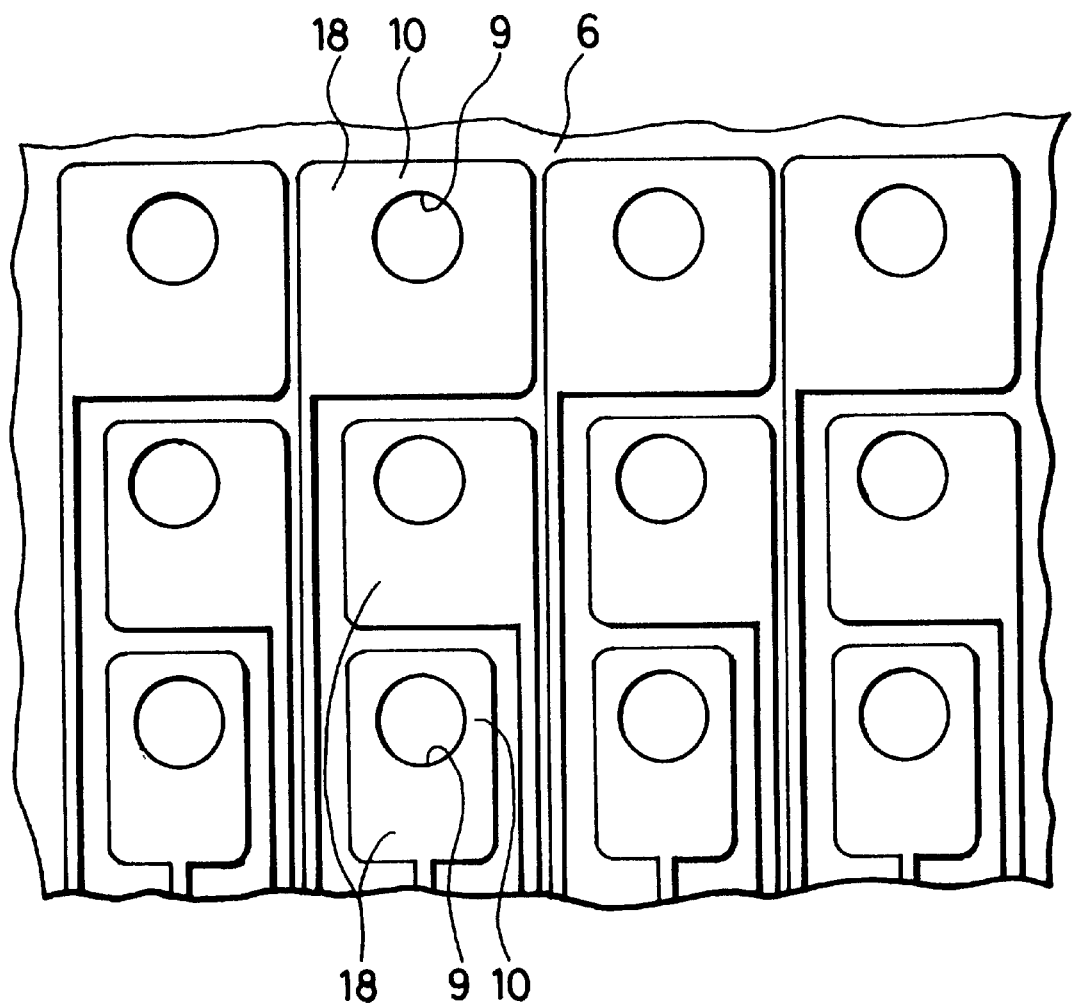
FIG. 8 is a plan view showing a state in which a wiring pattern and a dummy wiring pattern are formed on an insulating substrate which is provided on a semiconductor device in accordance with yet another embodiment of the present invention.

Also, as another way of reducing the concave and convex portions on the surface of the insulating substrate 6 as shown in FIG. 2, a wiring pattern 8a or an integral wiring pattern 18, as shown in FIG. 7 and FIG. 8, respectively, which are partially and entirely integrated wiring patterns of the wiring pattern 8 and the dummy wiring pattern 14, respectively, may be used.

The wiring pattern 8a as shown in FIG. 7 is formed by integrating the wiring pattern 8 with the dummy wiring

TABLE 1

| No. | Wiring | Thickness of Solder Resist | The Number of Temperature Cycles (cyc.) | | | | | | | | |
|-----|--------|---------|-----|-----|------|------|------|------|------|------|------|
| | | | 100 | 500 | 1000 | 1500 | 1600 | 1700 | 1800 | 1900 | 2000 |
| A | Present Invention | 30 μm | 0/15 | 0/15 | 0/15 | 0/15 | 0/15 | 0/15 | 0/15 | 0/15 | 0/15 |
| B | Present Invention | 15 μm | 0/15 | 0/15 | 0/15 | 0/15 | 0/15 | 3/15 | 3/15 | 7/15 | 12/15 |
| C | Prior Art | 15 μm | 0/15 | 0/15 | 0/15 | 1/15 | 2/15 | 6/15 | 7/15 | 10/15 | 12/15 | pattern 14 in the vicinity of the external connection region 10 of the wiring pattern 8 as shown in FIG. 2, and the dummy wiring pattern 14 is formed between the external connection region 10, thereby reducing the concave and convex portions on the surface of the insulating substrate 6.

On the other hand, the integrated wiring pattern 18 as shown in FIG. 8 is formed by completely integrating the dummy wiring pattern 14 with the wiring pattern 8, thereby reducing the concave and convex portions on the surface of the insulating substrate 6.

As in the case of the integrated wiring pattern 18 of FIG. 8, by completely integrating the wiring pattern 8 and the dummy wiring pattern 14, the number of manufacturing steps can be reduced compared with the case where the wiring pattern 8 and the dummy wiring pattern 14 are separately manufactured.

Note that, in the case of adopting the integrated wiring pattern 18 of FIG. 8, provided that the integrated wiring pattern 18 is not electrically connected to another integrated wiring pattern 18, the wiring pattern and the dummy wiring pattern of the integrated wiring pattern 18 may be made of different materials.

Also, the dummy wiring pattern 14 formed around the wiring pattern 8a of FIG. 7 may be a conductive film or insulating film, provided that it has the same thickness as that of the wiring pattern 8a.

Therefore, as shown in FIG. 2 and FIG. 7, when the wiring pattern 8 and the dummy wiring pattern 14, and also the wiring pattern 8a and the dummy wiring pattern 14 are separately formed, it is preferable that the wiring pattern 8 (8a) and the dummy wiring pattern 14 are made of the same material in reducing the number of manufacturing steps.

Figure 15:
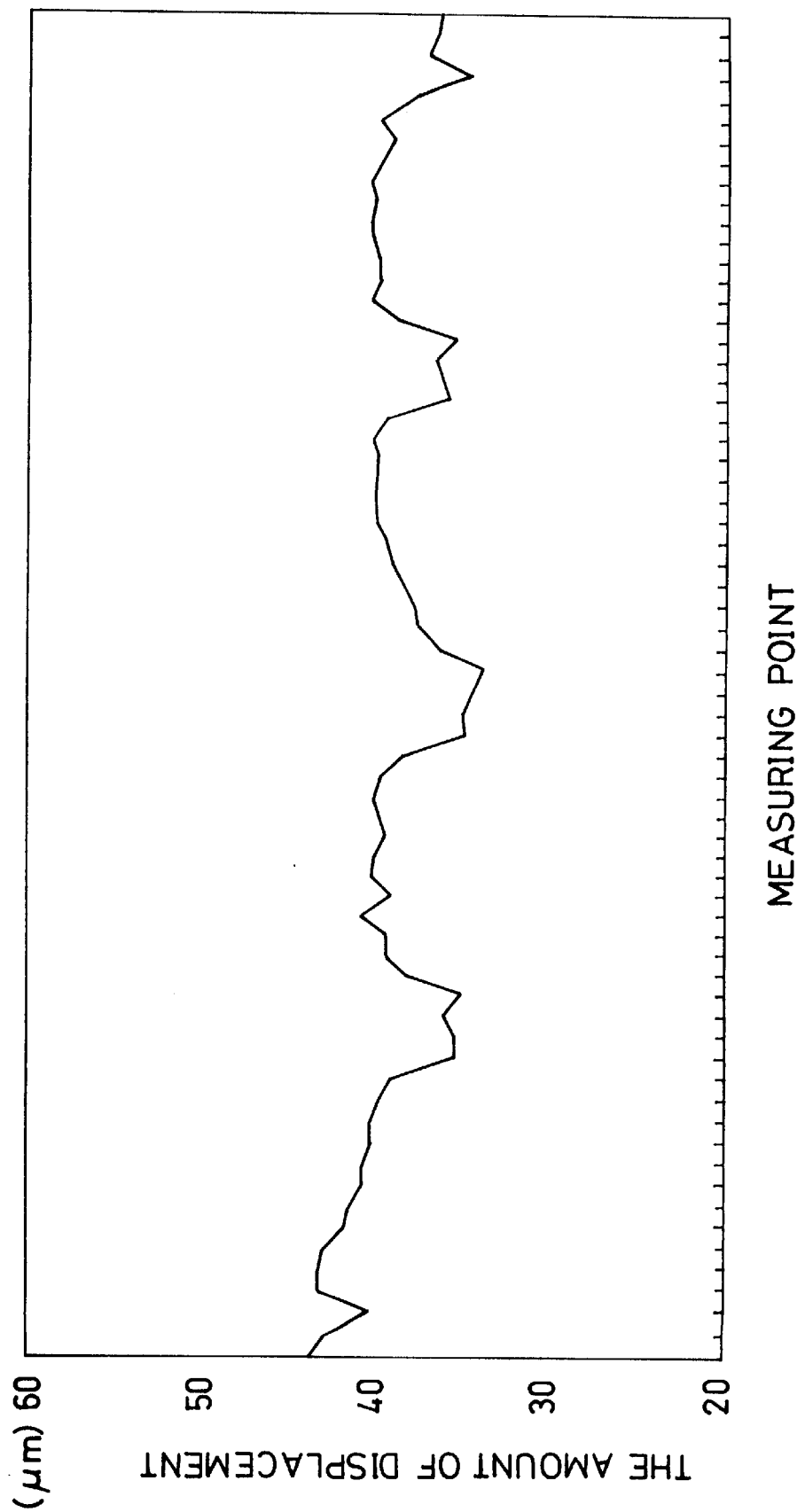
FIG. 15 is a graph showing a change in amount on a line A—A on a surface of a solder resist formed on the insulating substrate of FIG. 7 when the thickness of the solder resist is 15 μm.

Here, FIG. 15 shows a change in amount of displacement on the surface of the solder resist 7 when it is formed on the surface of the insulating substrate 6, in the case where the wiring pattern 8a and the dummy wiring pattern 14 are formed on the insulating substrate 6 as shown in FIG. 7. Namely, FIG. 15 is a graph showing a change in amount of displacement on the surface of the solder resist 7, corresponding to a cross section taken along a line A—A on the insulating substrate 6, when the solder resist 7 is formed on the surface of the insulating substrate 6 of FIG. 7.

Figure 14:
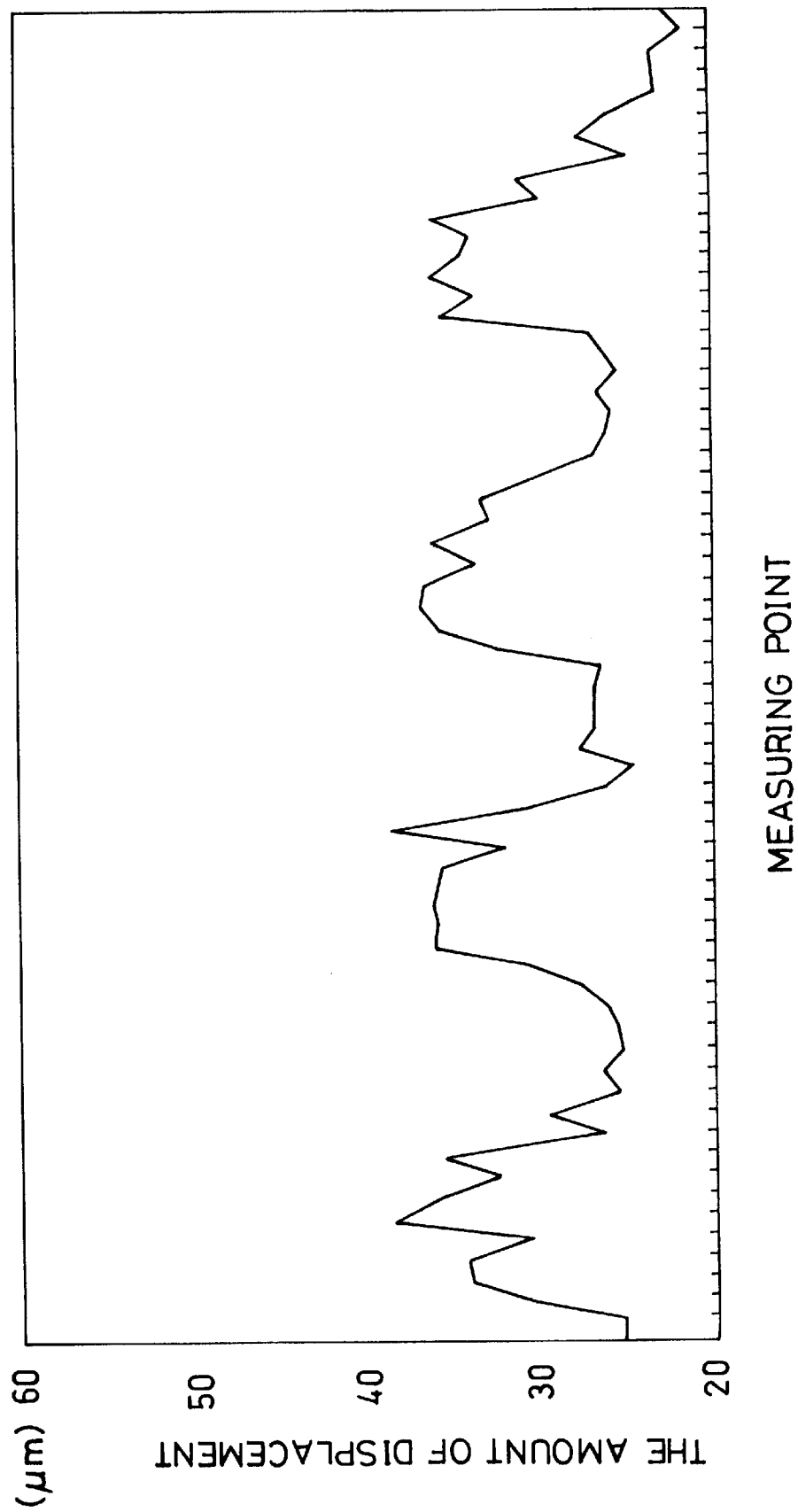
FIG. 14 is a graph showing a change in amount on a line B—B on a surface of a solder resist formed on the insulating substrate of FIG. 12.

Also, FIG. 14 shows, as a comparative example of the change in amount of displacement on the surface of the solder resist 7 of FIG. 15, a change in amount of displacement on the surface of the solder resist 27 when it is formed on the surface of the insulating substrate 26 shown in FIG. 12. Namely, FIG. 14 is a graph showing a change in amount of displacement on the surface of the solder resist 27, corresponding to a cross section taken along a line B—B on the insulating substrate 26, when the solder resist 27 is formed on the surface of the insulating substrate 26 shown in FIG. 12.

The solder resist 7 and solder resist 27 are both formed in a thickness of 15 μm.

From the graphs of FIG. 14 and FIG. 15, and as indicated by the present invention, it is clear that the change in amount of displacement on the surface of the solder resist 7 is smaller when the concave and convex portions on the surface of the insulating substrate 6 are reduced by providing the dummy wiring pattern 14.

Figure 9:
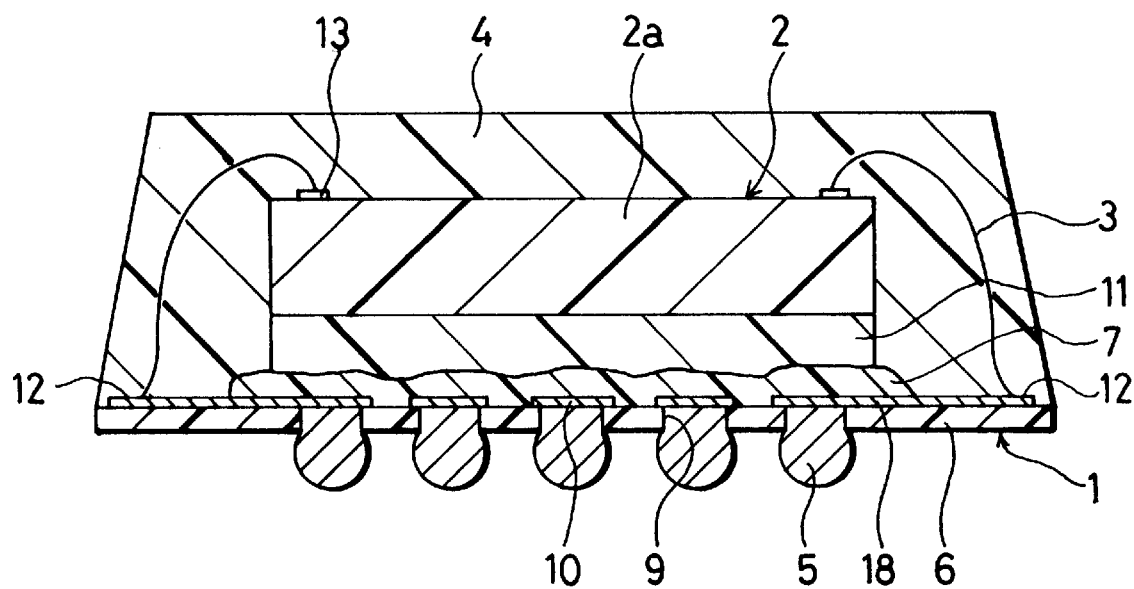
FIG. 9 is a schematic cross sectional view of a semiconductor device in accordance with still another embodiment of the present invention.
Figure 10:
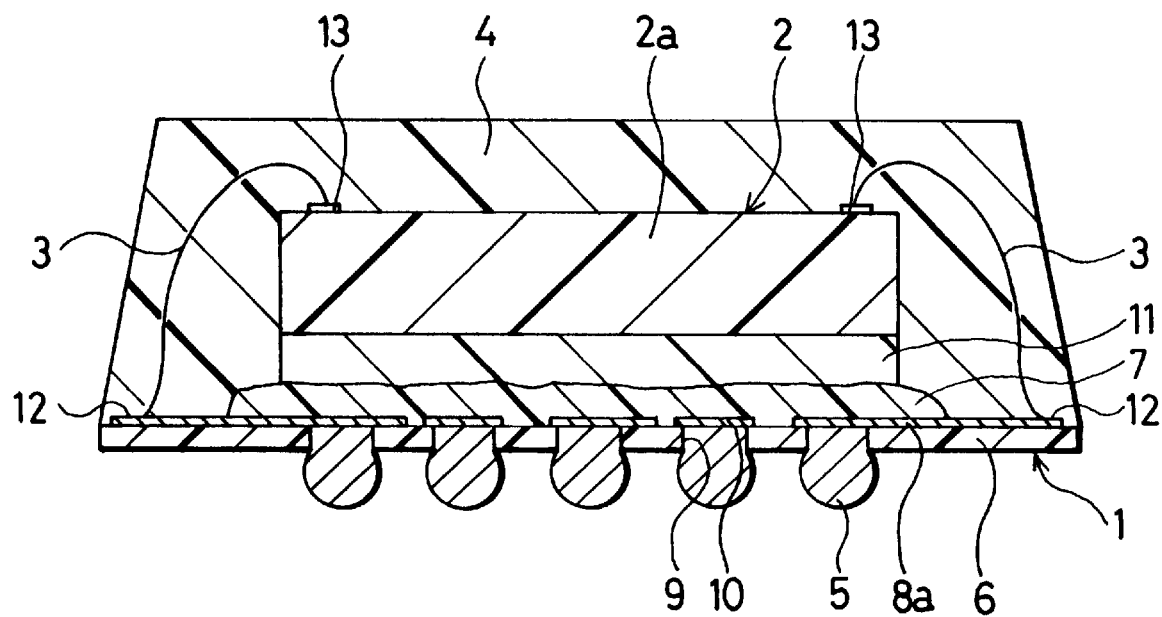
FIG. 10 is a schematic cross sectional view of a semiconductor device in accordance with yet another embodiment of the present invention.

Also, as shown in FIG. 9 and FIG. 10, the surface of the solder resist 7 can be leveled as well by further increasing the thickness of the solder resist 7 from the thickness of the solder resist 7 as shown in FIG. 1. This is possibly due to that fact that the adverse effect of the concave and convex portions on the surface of the insulating substrate 6 are weakened by the increased thickness of the solder resist 7.

Figure 16:
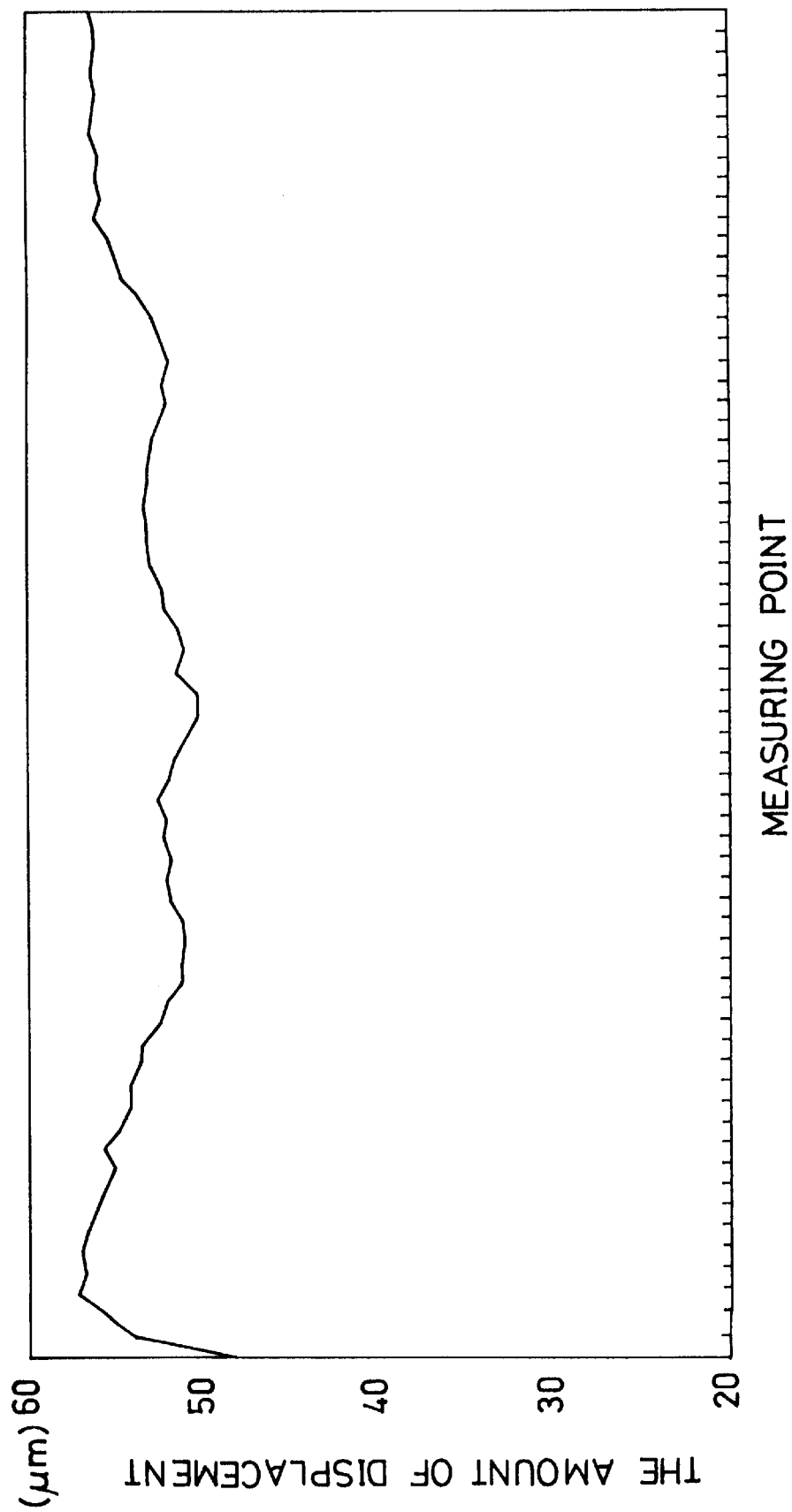
FIG. 16 is a graph showing a change in amount on a line A—A on a surface of a solder resist formed on the insulating substrate of FIG. 7 when the thickness of the solder resist is 30 μm.

Thus, when the thickness of the solder resist 7 is increased from 15 μm to 30 μm under the same condition as the graph of FIG. 15, the graph takes the form as shown in FIG. 16 which shows a change in amount of displacement on the surface of the solder resist 7, corresponding to a cross section taken along a line A—A on the insulating substrate 6, when the solder resist 7 is formed on the surface of the insulating substrate 6 of FIG. 7.

From the graph of FIG. 16, it can be seen that the change in amount of displacement on the surface of the solder resist 7 is smaller than the change in amount of displacement on the surface of the solder resist 7 of FIG. 15.

When increasing the thickness of the solder resist 7 in this manner, the thickness in general is preferably not less than 20 μm and not more than 50 μm. Namely, when the thickness of the solder resist 7 is thinner than 20 μm, it becomes susceptible to the effect of the concave and convex portions on the surface of the insulating substrate 6, and when the thickness of the solder resist 7 is thicker than 50 μm, the shrinkage of the solder resist 7 becomes large, and the problem arises that the wiring substrate 1 is bowed.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
a wiring substrate having at least wiring and a wiring protective film of an insulating material for protecting the wiring, the wiring and the wiring protective film being provided on an insulating substrate;
a semiconductor chip having a first surface provided with a circuit and a second surface to which an adhesive film of an insulating material is adhered, said semiconductor chip being adhered by said adhesive film to said wiring substrate so as to face a surface of the wiring substrate on which the wiring is provided; and
a conducting wire for connecting the circuit provided on the surface of said semiconductor chip and the wiring of the wiring substrate,
wherein a surface of the wiring protective film and said semiconductor chip are firmly adhered to each other.

2. A semiconductor device, comprising:
a wiring substrate having at least wiring and a wiring protective film for protecting the wiring, the wiring and the wiring protective film being provided on an insulating substrate;
a semiconductor chip having a first surface provided with a circuit and a second surface to which an adhesive film is adhered said semiconductor chip being adhered by said adhesive film to said wiring substrate so as to face a surface of the wiring substrate on which the wiring is provided; and
a conducting wire for connecting the circuit provided on the surface of the said semiconductor chip and the wiring of the wiring substrate,
wherein dummy wiring is provided on a region of the insulating substrate where the wiring is not provided.

3. The semiconductor device as set forth in claim 2, wherein the wiring on the insulating substrate is connected to the dummy wiring so as to be insulated therefrom.

4. The semiconductor device as set forth in claim 2, wherein the wiring on the insulating substrate and the dummy wiring are integrally formed.

5. The semiconductor device as set forth in claim 2, wherein a size of the adhesive film is set to be the same as that of the surface of said semiconductor chip to which the adhesive film is adhered.

6. The semiconductor device as set forth in claim 2, wherein the adhesive film is made of a material selected from the group consisting of polyimide resin, epoxy resin, and a mixture of polyimide resin and epoxy resin.

7. A semiconductor device, comprising:

a wiring substrate having at least wiring and a wiring protective film of an insulating material for protecting the wiring, the wiring and the wiring protective film being provided on an insulating substrate;

a semiconductor chip having a first surface provided with a circuit and a second surface to which an adhesive film of an insulating material is adhered, said semiconductor chip being adhered by said adhesive film to said wiring substrate so as to face a surface of the wiring substrate on which the wiring is provided; and a conducting wire for connecting the circuit provided on the surface of said semiconductor chip and the wiring of the wiring substrate, wherein a thickness of the wiring protective film is set such that a surface shape thereof is not affected by a shape of the wiring.

8. The semiconductor device as set forth in claim 7, wherein the thickness of the wiring protective film is not less than 20 $\mu$m and not more than 50 $\mu$m.

9. The semiconductor device as set forth in claim 7, wherein a size of the adhesive film is set to be the same as that of the surface of said semiconductor chip to which the adhesive film is adhered.

10. The semiconductor device as set forth in claim 7, wherein the adhesive film is made of a material selected from the group consisting of polyimide resin, epoxy resin, and a mixture of polyimide resin and epoxy resin.

* * * * *